(12) United States Patent
Berman et al.

(10) Patent No.: US 6,849,936 B1
(45) Date of Patent: Feb. 1, 2005

(54) SYSTEM AND METHOD FOR USING FILM DEPOSITION TECHNIQUES TO PROVIDE AN ANTENNA WITHIN AN INTEGRATED CIRCUIT PACKAGE

(75) Inventors: Michael J. Berman, West Linn, OR (US); Rennie G. Barber, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/254,473

(22) Filed: Sep. 25, 2002

(51) Int. Cl.$^7$ .............................................. H01L 23/02
(52) U.S. Cl. ........................ 257/679; 257/684; 257/685; 257/690; 257/698; 438/106; 438/110; 438/117; 438/121
(58) Field of Search ................................ 257/679, 684, 257/685, 690, 698, 728, 725, 704, 710, 774, 680; 438/106, 110, 117, 121

(56) References Cited

U.S. PATENT DOCUMENTS

| | | | |
|---|---|---|---|
| 4,857,893 A | | 8/1989 | Carroll |
| 5,023,624 A | * | 6/1991 | Heckaman et al. ......... 343/860 |
| 5,483,678 A | * | 1/1996 | Abe ............................ 455/80 |
| 5,528,222 A | | 6/1996 | Moskowitz et al. |
| 5,682,143 A | | 10/1997 | Brady et al. |
| 6,014,113 A | * | 1/2000 | Orchard et al. ............. 343/841 |
| 6,243,040 B1 | * | 6/2001 | Corey et al. ......... 343/700 MS |
| 6,268,796 B1 | | 7/2001 | Gnadinger et al. |
| 6,320,543 B1 | * | 11/2001 | Ohata et al. ......... 343/700 MS |
| 6,362,525 B1 | | 3/2002 | Rahim |
| 6,373,447 B1 | * | 4/2002 | Rostoker et al. ............ 343/895 |
| 6,396,078 B1 | | 5/2002 | Uochi et al. |
| 6,421,013 B1 | | 7/2002 | Chung |
| 6,607,135 B1 | * | 8/2003 | Hirai et al. ................. 235/487 |

* cited by examiner

*Primary Examiner*—Nathan J. Flynn
*Assistant Examiner*—Remmon R. Fordé
(74) *Attorney, Agent, or Firm*—Maginot, Moore & Beck

(57) ABSTRACT

An integrated circuit package comprises a cavity for housing an integrated circuit (IC) and an antenna provided as part of the package that is located substantially outside the cavity. The antenna may be located on the floor of the IC package that lies in the region outside of the IC cavity. Alternatively, the antenna may be located on the upper or lower surface of the lid sealing the IC package. The antenna may be placed in the floor or on a surface of the IC lid by forming depressions in the floor or lid surface and depositing conductive material in the depressions. The conductive material deposition may be by sputtering, evaporation, or other known physical or chemical deposition method. Antennas formed in the upper surface of an IC lid may be coupled to a pin of the IC package so that the antenna may be electrically coupled to a transceiver component on the IC within the package. Antennas formed in the lower surface of an IC lid or the floor of the IC package may be coupled by a conductive pin to a component pad of the IC within the package. To reduce electromagnetic noise that may be induced by the radio frequency signals emitted or received by an antenna, a grounding plane may be provided as part of the IC package. The grounding plane may be coupled to an electrical ground reference point through an IC package pin or the IC within the package.

10 Claims, 9 Drawing Sheets

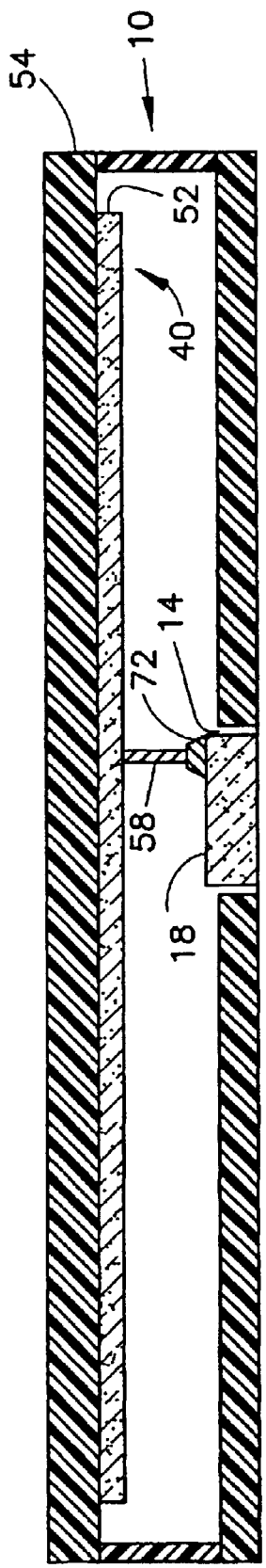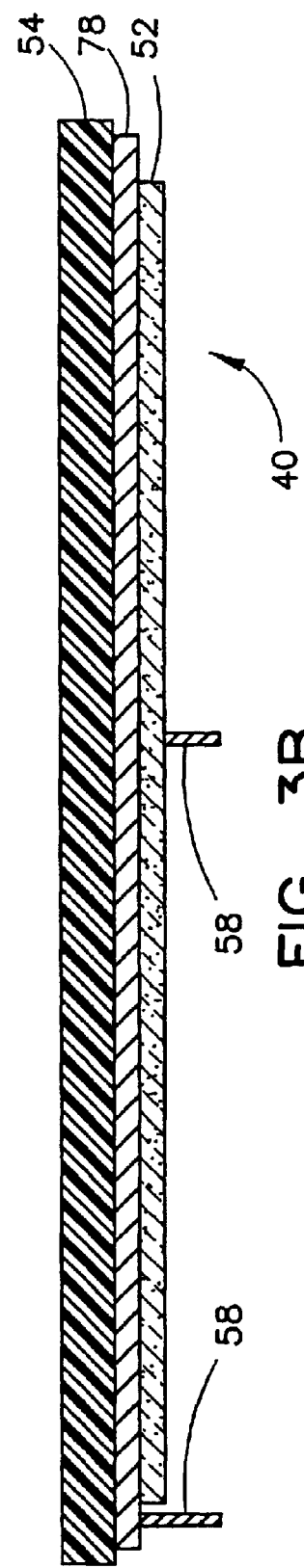
FIG. 3A
FIG. 3B

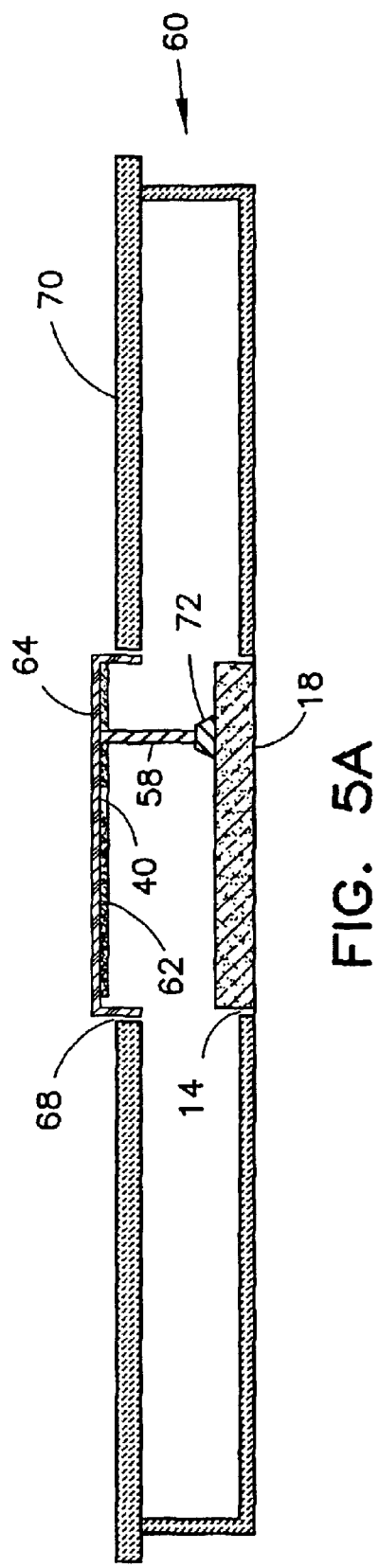
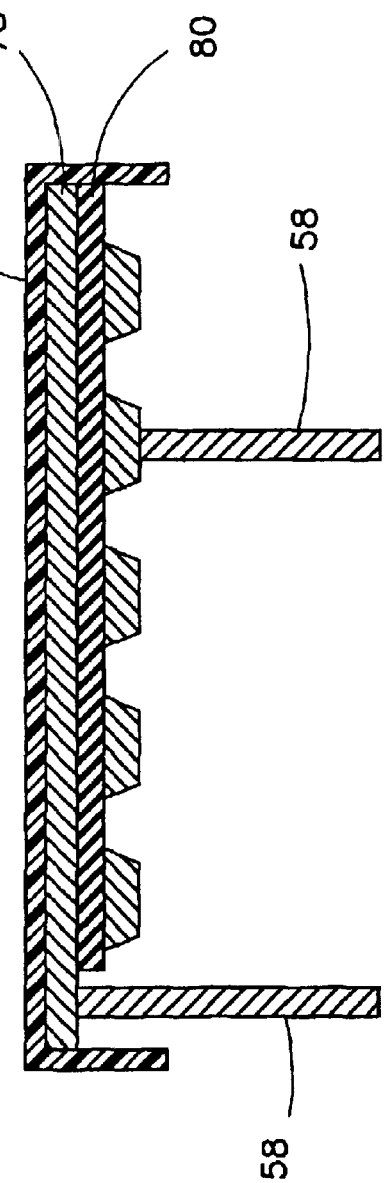

SYSTEM AND METHOD FOR USING FILM DEPOSITION TECHNIQUES TO PROVIDE AN ANTENNA WITHIN AN INTEGRATED CIRCUIT PACKAGE

FIELD OF THE INVENTION

This invention relates generally to antennas used with integrated circuits and, more particularly, to antennas coupled to integrated circuits within an integrated circuit package.

BACKGROUND OF THE INVENTION

Wireless communication devices are becoming increasingly ubiquitous as more peripheral devices are interfaced with voice communication devices and personal digital assistants (PDAs). The demand for wireless communication with peripheral devices has led to the development of the Bluetooth and IEEE 801.11 communication standards. As these communication standards are accepted and incorporated within the integrated circuits used to implement computer peripherals, the need for antennas that radiate and receive communications at radio frequencies (RF), especially those in the 2.4 to 5 GHz range, will increase.

One way to meet this need is to provide antennas as additional components in the computer peripherals and other wireless communication devices. Antennas provided in this manner may be coupled to an integrated circuit implementing a transceiver through electrical leads soldered to conductive traces on the printed circuit boards (PCBs) in such devices.

In an effort to incorporate antennas within the package for an integrated circuit, substrates have been provided with conductive traces or lengths of bonding wire. These substrates may then be mounted on top of a die containing an integrated circuit using thermal and compression techniques. The electrical components of the die must then be electrically coupled to the antenna so electrical signals may be radiated or received through the antenna. One way of coupling an antenna pad to a component pad is wire bonding while another method uses conductive adhesive inserted into a via to electrically couple an antenna pad to a component pad. When the antenna substrate and integrated circuit substrate are mounted so the antenna and integrated circuit have no intervening substrate between them, as is the case in the so-called "flip chip" arrangement, one or more conductive bumps may be used to electrically couple the components of the substrates. The vertical stacking of substrates in these methods requires the design of pads, vias, and/or conductive bumps on the two substrates and the alignment of these structures during manufacture to successfully couple transceiver components to an antenna. Such alignment may be problematic.

Furthermore, the area of a substrate on which an antenna is placed may be insufficient to provide an antenna of the best physical parameters and geometry. Also, the vertical stacking of substrates may make the dissipation of heat generated by the integrated circuit difficult.

What is needed is a way of providing an antenna within an integrated circuit package without requiring the vertical stacking of substrates.

What is needed is a way of providing an antenna within an integrated circuit package without impairing the dissipation of heat from the area surrounding the integrated circuit.

What is needed is a way of providing more space for the layout of an antenna than is available on a substrate that may be supported by a die on which an integrated circuit is provided.

SUMMARY OF THE INVENTION

The above-noted limitations of previously known methods and structures for providing antennas within an integrated circuit package have been overcome by a system and method that operate in accordance with the principles of the present invention. The integrated circuit package of the present invention comprises a cavity in an integrated circuit package for housing an integrated circuit (IC) and an antenna provided as part of the package and located substantially outside the cavity. By placing the antenna outside the cavity housing the integrated circuit, the surface on which the antenna is placed does not need to be vertically mounted over the integrated circuit. Consequently, the pads of the antenna and the integrated circuit need not be aligned and the antenna does not interfere with the thermal dissipation properties of the region surrounding the integrated circuit.

By using the portion of the integrated circuit package that lies outside of the cavity for the integrated circuit for the antenna, the area used for the antenna is not constrained by the dimensions of the die on which the integrated circuit is located. Thus, a larger antenna may be provided, the traces comprising the antenna may be wider or thicker than those on a die-sized substrate, and the geometry of the antenna may not be as confined as it might be on a substrate the size of the integrated circuit die.

In one embodiment of the present invention, the antenna may be provided in the interior portion of a molded IC package that lies outside of the IC cavity of the package. The geometric pattern for the antenna may be cut into the region using a damascene process. Then conductive material for the antenna traces may be deposited in the antenna pattern by evaporation, sputtering, or other known deposition methods. The antenna may then be electrically coupled to the IC within the IC cavity by wire bonding to either a pad located on the IC die or at a pin pad on the die. Alternatively, the antenna may be provided in the interior region of the molded IC package using a silk screen process to apply conductive materials to the region through a silk screen that has been imprinted with the antenna pattern by means of a photoresist process. Again, the antenna in the interior region of the molded IC package may be coupled to component pads or pin pads on the IC die using wire bonds before the IC package is sealed. General photolithography processes that are known may also be used to provide an antenna in the interior region of an IC package. A laser draw or an electronic beam direct write process may also be used to provide an antenna within an IC package. The draw or write process may be used to provide a depression in the form of an antenna pattern so that metal may be deposited in the pattern and a chemical mechanical polishing process is used to remove excess metal.

In another embodiment of the present invention, an external antenna may be mounted to the exterior surface of a molded IC package or to the interior or exterior surface of a lid for sealing a ceramic IC package. To construct the antenna, a wafer substrate may be etched with an antenna pattern using a photoresist process and then conductive material is deposited in the pattern by evaporation, sputtering, or other similar deposition techniques. The substrate may be cut into dimensions that substantially correspond to the length and width of a ceramic package lid or to dimensions that substantially correspond to the width of a molded IC package while having a length that is less than the length of the molded IC package. Conductive tabs may extend from the lid. At the substrate, the ends of the antenna to be coupled to the transceiver of the IC may be soldered or otherwise electrically coupled to the conductive tabs. The ends of the conductive tabs may mechanically mate with the leads of the IC package that are coupled to the transceiver components of the IC in the interior of the package. Alternatively, the substrate bearing the antenna may be mounted to the underside of the lid using epoxy or the like so that the antenna is in "flip chip" orientation with respect to the IC die. Conductive pins may be soldered or to the antenna pads for coupling the antenna to the IC die or conductive adhesives may be used to connect a pin to an antenna pad. When the lid is placed on the ceramic package to seal the package, compression techniques may be used to connect the outboard end of a conductive pin to a component pad on the IC die so components of the IC may be electrically coupled to the antenna for transceiver operation.

For molded IC packages, an antenna substrate could be formed as discussed above and then mounted to the upper surface of a sealed IC package. Conductive tabs may extend from the substrate to connect the antenna pads to pins on the package so components on the IC die may be electrically coupled to the antenna. Of course, such an antenna bearing substrate may be mounted to the underside of the molded IC package lid and conductive pins extending from the antenna pads could be connected to component pads on the IC die using compression methods as discussed above. Alternatively, a damascene process, a photolithography process, silk screening process, draw or write process may be used to provide conductive traces in an antenna pattern to the underside of the molded IC package lid and conductive pins soldered or otherwise connected to the antenna pads for connection to component pads on the IC die.

In order to reduce the likelihood of the induction of RF noise in the components of the IC die, a grounding plane may be incorporated in the various embodiments of the present invention. In the embodiments in which an antenna is deposited in a portion of the interior region of an IC package that lies outside the IC die cavity, the grounding plane may be deposited on the floor of the package interior outside the cavity. Preferably, the grounding plane is comprised of a good conductive material such as gold or a nickel/gold composite. An insulating layer may be deposited over the grounding plane and then etched for the deposition of the conductive traces used to form the antenna provided the etching does not expose the grounding plane. The insulating layer preferably leaves a grounding pad exposed so the grounding plane may be connected by wire bonding the grounding pad to the signal ground for the IC die.

In the embodiments having an antenna bearing substrate that is mounted to the exterior of the molded IC package lid, a conductive grounding plane may be provided on the surface of the substrate opposite the antenna using a deposition technique. A conductive tab may then be soldered or otherwise connected to the grounding plane and the outboard end of the tab may be connected by soldering or other known connecting method to an electrical or signal ground pin of the package. In embodiments where the antenna bearing substrate is mounted to the underside of the lid sealing the molded IC package, a conductive grounding plane may be provided on the surface of the substrate opposite the antenna using a deposition technique. The deposition may be performed in a manner that leaves a grounding pad exposed so a conductive pin may be connected to the pad. When the package is sealed with the lid, the outboard end of the lid may connect with a signal ground pad on the IC die using a compression method to electrically couple the grounding plane to the electrical ground for the IC die.

The provision of a grounding plane between the antenna and the IC die helps reduce RF interference caused by electromagnetic radiation emitted or received at the antenna. Thus, an antenna may be provided in the interior of a ceramic or molded IC package with reduced likelihood of RF interference disturbing the operation of the IC. Likewise, an antenna may be provided adjacent to the exterior of the ceramic or molded IC package without causing substantial RF interference with the operation of the IC within the package.

The method of the present invention includes placing an antenna trace outside the integrated circuit (IC) cavity of an integrated circuit package and coupling the antenna trace to the IC housed within the IC cavity. By placing the antenna in the portion of the integrated circuit package that lies outside of the IC cavity, the area used for the antenna is not constrained by the dimensions of the die on which the integrated circuit is located. Thus, a larger antenna may be provided, the traces comprising the antenna may be wider or thicker than those on a die-sized substrate, and the geometry of the antenna may not be as confined as it might be on a substrate the size of the integrated circuit die.

In one method incorporating the principles of the present invention, the antenna trace is placed in the interior portion of an IC package that lies outside of the IC cavity of the package. The geometric pattern for the antenna may be cut into the region using a photoresist, a damascene, draw or a write process. Then conductive material for the antenna traces may be deposited in the antenna pattern by evaporation, sputtering, or other known deposition methods. Excess conductive material may be removed by chemical mechanical polishing (CMP). The antenna may then be electrically coupled to the IC within the IC cavity by wire bonding to either a component pad located on the IC die or a pin pad on the die. Alternatively, the antenna trace may be placed on the floor of a molded IC package or IC package lid by bonding a wound conductor to the floor or lid surface. The antenna may be coupled to a component pad on the IC die using wire bonds before the IC package is sealed.

In order to reduce the likelihood of the induction of RF noise in the components of the IC die, a grounding plane may be incorporated in the various embodiments of the present invention. In the embodiments in which an antenna is deposited in a portion of the interior region of an IC package that lies outside the IC die cavity, the grounding plane may be deposited on the floor of the package interior outside the cavity. Preferably, the grounding plane is comprised of a good conductive material such as gold or a nickel/gold composite. An insulating layer may be deposited over the grounding plane and then etched for the deposition of the conductive traces used to form the antenna. The insulating layer preferably leaves a grounding pad exposed so the grounding plane may be connected by wire bonding the grounding pad to the signal ground for the IC die.

In the method that places an antenna trace on the upper surface of an IC package lid for mounting to the exterior of a molded IC package lid, a conductive grounding plane may be provided on the surface of the lid antenna using a deposition technique. A conductive tab may then be soldered or otherwise connected to the grounding plane and the outboard end of the tab may be connected by soldering or other known connecting method to an electrical or signal ground pin of the package. In methods where the antenna is placed on the underside of the lid sealing an IC package, a conductive grounding plane may be provided on the lower surface of the lid using a deposition technique. The deposition may be performed in a manner that leaves a grounding pad exposed so a conductive pin may be connected to the pad. When the package is sealed with the lid, the outboard end of the lid may connect with a signal ground pad on the IC die using a compression method to electrically couple the grounding plane to the electrical ground for the IC die.

The provision of a grounding plane between the antenna and the IC die helps reduce RF interference caused by electromagnetic radiation emitted or received at the antenna. Thus, an antenna trace may be placed in the interior of a ceramic or molded IC package with reduced likelihood of RF interference disturbing the operation of the IC. Likewise, an antenna trace may be placed adjacent the exterior of a ceramic or molded IC package without causing substantial RF interference with the operation of the IC within the package.

It is an object of the present invention to provide an antenna within an IC package without stacking a substrate having an antenna on the IC housed in the package.

It is an object of the present invention to reduce the likelihood of RF interference with the operation of the IC housed in the package that may be caused by electromagnetic radiation emitted or received by an antenna mounted within the package or adjacent its exterior.

These and other advantages and features of the present invention may be discerned from reviewing the accompanying drawings and the detailed description of the invention.

BRIEF DESCRIPTION OF THE DRAWINGS

The present invention may take form in various system and method components and arrangement of system and method components. The drawings are only for purposes of illustrating exemplary embodiments and are not to be construed as limiting the invention.

FIG. 3A is a cross-sectional view of an IC package in which an antenna is provided on the underside of the IC package lid and coupled to the IC in the IC cavity of the package through a conductive pin;

FIG. 3B is a cross-sectional view of the IC lid of FIG. 3A with a grounding plane interposed between the antenna and the upper surface of the IC lid;

FIG. 5A is a cross-sectional view of the IC lid of FIG. 4A depicting the coupling of the antenna to the IC in the IC cavity through a conductive pin;

FIG. 5B is a cross-sectional view of an IC lid with a grounding plane interposed between the upper surface of the IC lid and the antenna;

DETAILED DESCRIPTION OF THE INVENTION

Figure 1:
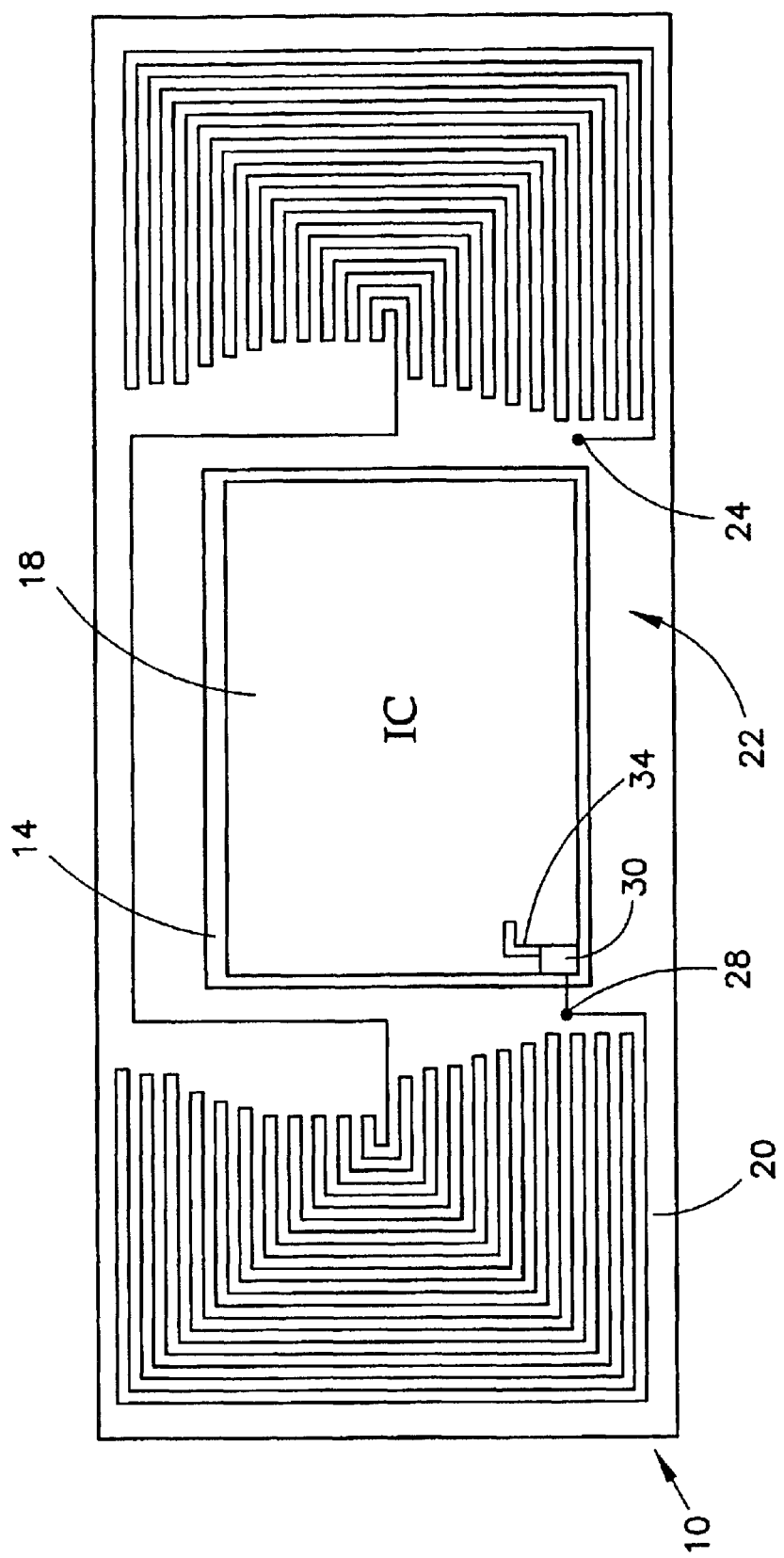
FIG. 1 is a top plan view of a package with its sealing lid removed to expose an exemplary antenna/IC cavity arrangement of the present invention.

An integrated circuit package 10 of the present invention is shown in FIG. 1 and comprises a cavity 14 for housing an integrated circuit (IC) 18 and an antenna 20 in the interior region 22 of package 10 that lies substantially outside the cavity. Antenna 20 has a terminating end 24 and a coupling end 28. Coupling end 28 may be wire bonded to component pad 30 on IC 18. As shown in FIG. 1, a conductive trace 34 leads from component pad 30 to a component (not shown) of IC 18. The lid that hermetically seals package 10 has been removed to expose the arrangement of antenna 20 with respect to cavity 14.

Antenna 20 may be placed in interior region 22 of IC package 10 by using a damascene process to form trenches in the floor of IC package. Alternatively, the trenches or depressions may be formed with a write process using an electronic beam or a draw process using a laser. Metal is then deposited in the trenches and excess metal may be removed by chemical-mechanical polishing (CMP). The deposition of conductive material in the antenna traces to form the antenna pattern may be performed by evaporation, sputtering, or other known deposition methods. The conductive metal used to form an antenna may include metals, conductive alloys, or magnetic permeable materials such as permalloy. The antenna may then be electrically coupled to the IC within the IC cavity by wire bonding to either a component pad located on the IC die or at a pin pad on the die. Alternatively, the antenna may be provided in the interior region of the molded IC package by using a silk screen or other known photolithography process to apply conductive materials to the region through a mask that has been imprinted with the antenna pattern by means of a photoresist process. Prior to applying the conductive material, a diffusion layer/adhesion layer may be deposited on the floor of IC package 10 by a known deposition technique. Again, the antenna in the interior region of the molded IC package may be coupled to component pads or pin pads on the IC die using wire bonds before the IC package is sealed.

Figure 2A:
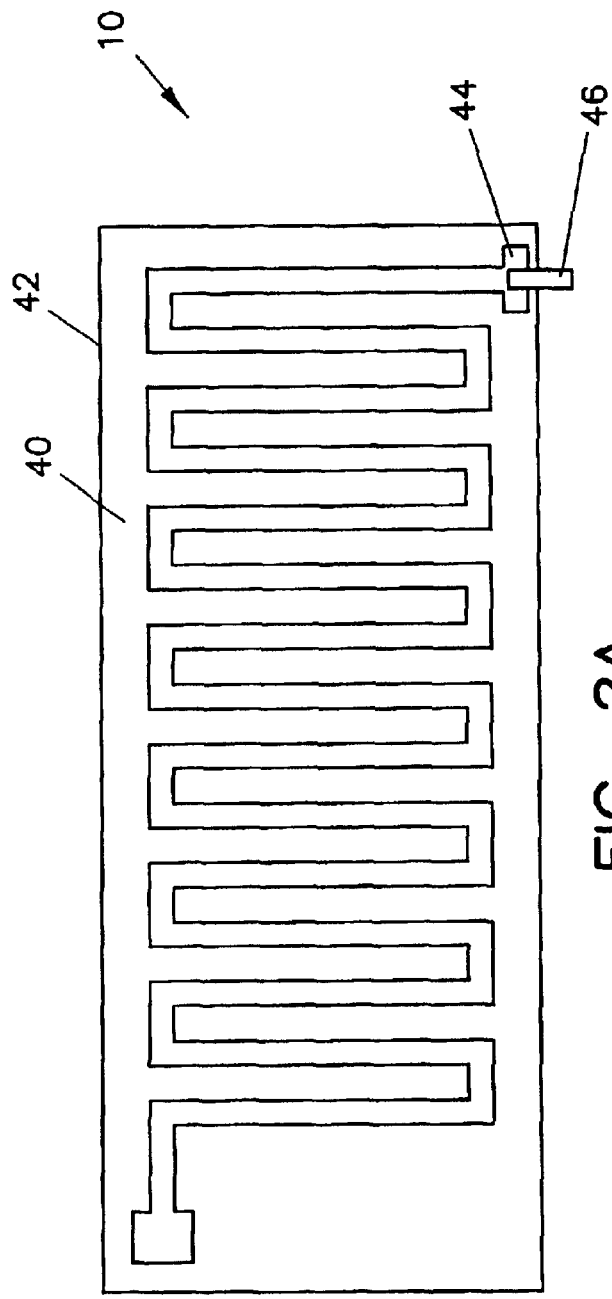
FIG. 2A is a top plan view of an IC lid having an antenna on its upper surface and a conductive tab for electrically coupling the antenna to a component within the IC package.
Figure 2B:
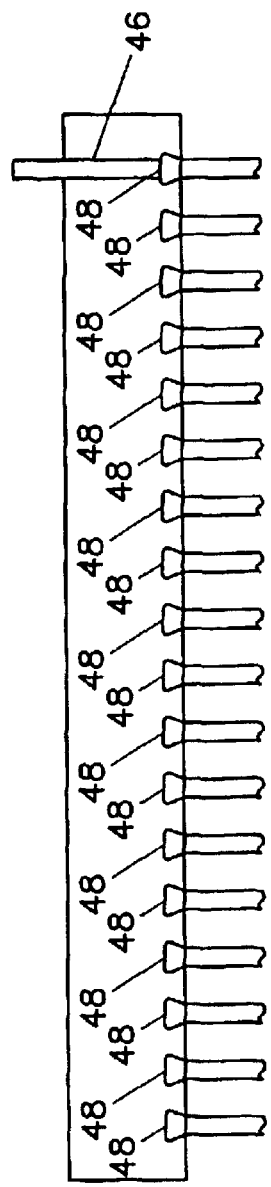
FIG. 2B is a side view of the package of FIG. 2A depicting the connection between the conductive tab and a pin of the IC package.

In an embodiment of the present invention shown in FIG. 2A, an antenna pattern and trace 40 may be placed on upper surface 42 of an IC package 10. To construct antenna 42, upper surface 42 of a lid for IC package 10 or a wafer substrate may be etched with an antenna pattern using a photoresist or a damascene process. Conductive material may be deposited in the pattern by evaporation, sputtering, or other similar deposition techniques. If an antenna is placed on a substrate, the substrate may be cut with dimensions permit the substrate to fit within the dimensions of the package lid and the substrate may be mounted to the lid of IC package 10 using epoxy or other known adhesive. A conductive tab 46 may be connected to antenna pad 44 by soldering or other known electrical connection method. Tab 46 preferably extends beyond the periphery of upper surface 42 and is bent so its outboard end may be connected to one of pins 48 of IC package 10 (FIG. 2B). The outboard end may be soldered or otherwise electrically connected to a pin 48. Tab 46 may be used to electrically couple antenna 40 to a transceiver element of IC die 18 within IC package 10 through one of the pins 48.

Alternatively, a substrate 52 bearing an antenna 40 may be mounted to the underside of a lid 54 using epoxy or the like as shown in FIG. 3A. In this configuration, antenna 40 is within the interior of IC package 10 in a "flip chip" orientation with respect to IC die 18. A conductive pin 58 may be soldered to an antenna pad 44 or attached using conductive adhesives or the like. Pin 58 may be used to electrically couple antenna 40 to a component pad on IC die 18. When lid 54 is placed on IC package 10 to seal the package, compression techniques may be used to connect the outboard end of conductive pin 58 to a component pad on IC die 18 so components of the IC may be electrically coupled to antenna 40 for transceiver operation. The component pad may have a conductive bump 72 mounted to its surface as is well known to mate with the end of pin 58 during the compression coupling of pin 58 and the component pad. As shown in FIG. 3A, antenna pad 44 may be located so conductive pin 58 is aligned with a component pad on IC die 18. As shown in FIG. 2A, antenna pad 44 may be located so conductive tab 46 extends towards the pin 48 of package 10 that is electrically coupled to a component pad of IC die 18 for transceiver operation. In yet another alternative arrangement, a damascene, draw or write process using conductive material deposition or a silk screening or other photolithography process may be used to provide conductive traces in an antenna pattern to the underside of an IC package lid 54. A conductive pin 58 may be soldered or otherwise connected to an antenna pad 44 for connection to component pads on IC die 18.

Figure 4A:
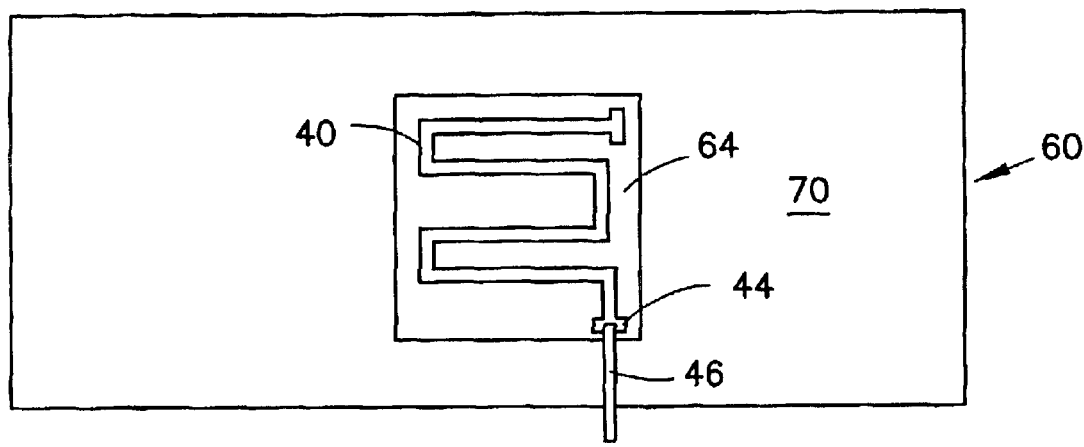
FIG. 4A is a top plan view of an antenna provided on an IC lid for a ceramic IC package and a conductive tab for coupling the antenna to a pin of the IC package.

An embodiment incorporating the principles of the present invention for ceramic IC packages is shown in FIG. 4A. Lid 64 closes an opening 68 in the upper surface of housing 70 above an IC die 18 housed within ceramic package 60. An antenna 40 may be placed on either the upper surface or the undersurface of lid 64 by a damascene, draw, or a write process followed by a metal deposition process or by a photolithography method as discussed above. Alternatively, a wafer substrate 62 may be etched and filled with conductive traces to form an antenna 40 and then mounted with adhesives to either the upper surface or the underside of lid 64. When antenna 40 is provided on top of lid 64, a conductive tab 46 may be mounted to antenna pad 44 and then bent to connect to one of the pins of package 60 that is coupled to a transceiver component of IC die 18 (FIG. 4A). When antenna 40 is provided in the "flip-chip" arrangement underneath lid 64, a conductive pin 58 may be mounted to an antenna pad 44 so it extends towards a component pad on IC die 18. Preferably, the component pad has a conductive bump 72 mounted over it so pin 58 may be electrically coupled to the component pad using a compression method (FIG. 5A).

Figure 7:
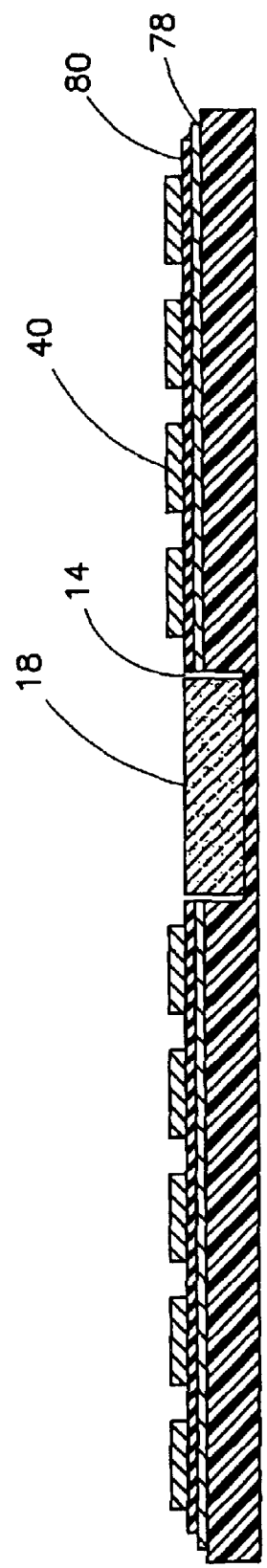
FIG. 7 is a cross-sectional view of the floor of an IC package showing an antenna provided in the region of the IC package floor outside of the IC cavity.

In order to reduce the likelihood of the induction of RF noise in the components of the IC die, a grounding plane 78 may be incorporated in the various embodiments of the present invention. In an embodiment in which an antenna is deposited in a portion of the interior region of an IC package that lies outside the IC die cavity, grounding plane 78 may be deposited on the floor of the package interior outside the cavity as shown in FIG. 7. Preferably, 78 grounding plane is comprised of a conductive material such as gold or a nickel/gold composite. An electrically insulating layer 80 may be deposited over grounding plane 78 and then etched for the deposition of the conductive traces used to form antenna 40. Insulating layer 80 preferably leaves a grounding pad exposed so the grounding pad of plane 78 may be connected by a wire bond to the signal ground for IC die 18.

Figure 4B:
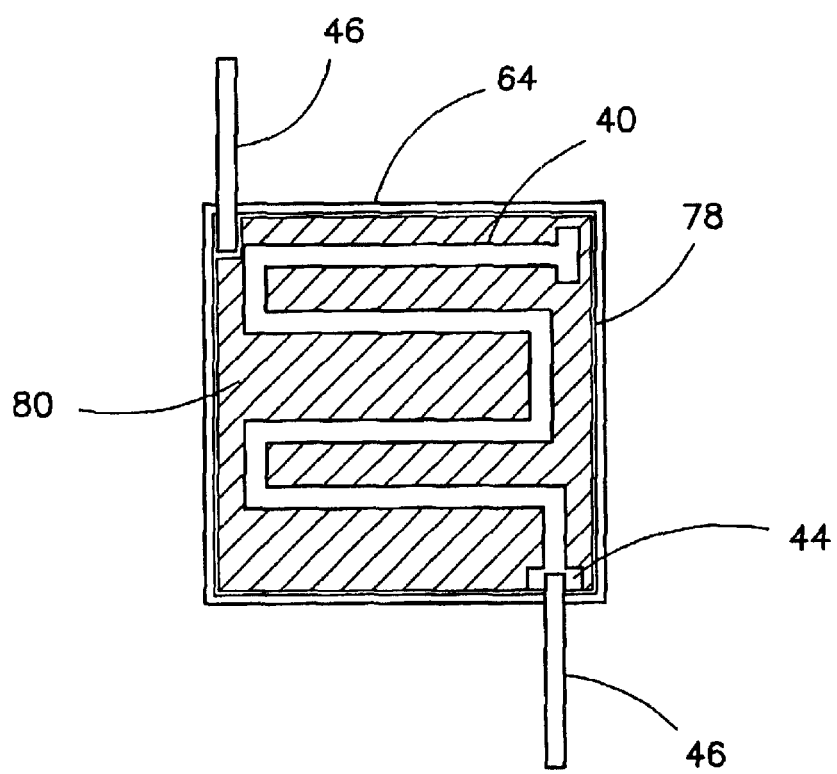
FIG. 4B is a top view of the IC lid of FIG. 4A with a grounding plane interposed between the upper surface of the IC lid and the antenna.
Figure 6A:
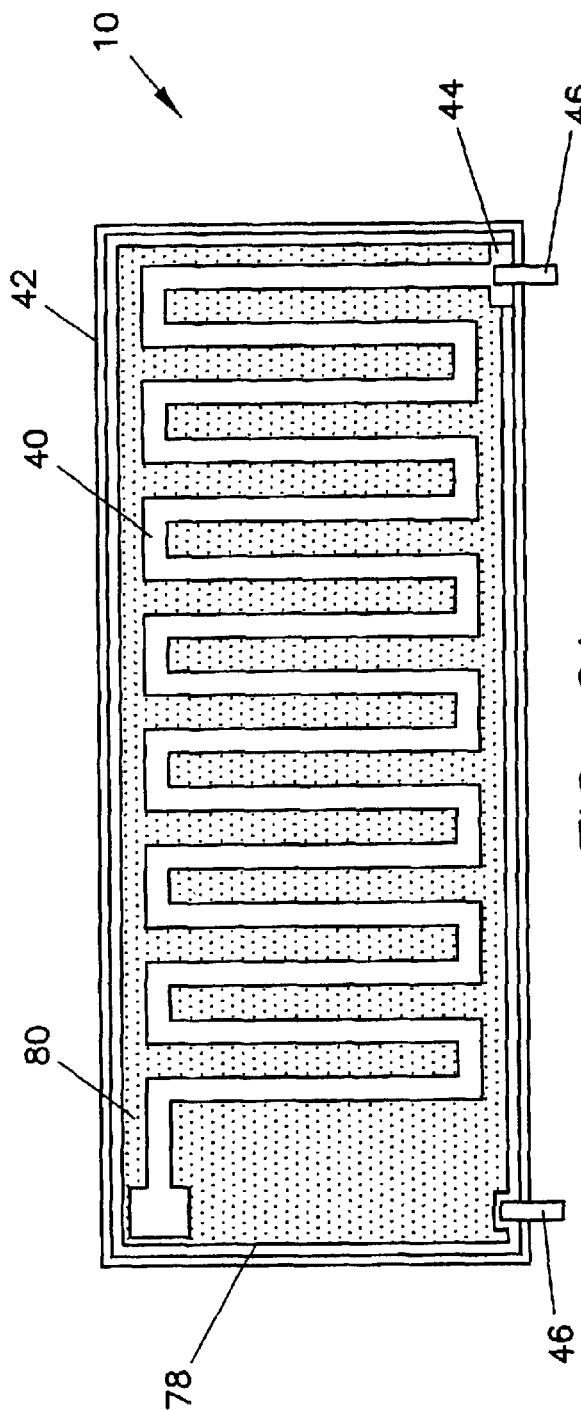
FIG. 6A is a top plan view of an IC lid having a grounding plane underneath the antenna.
Figure 6B:
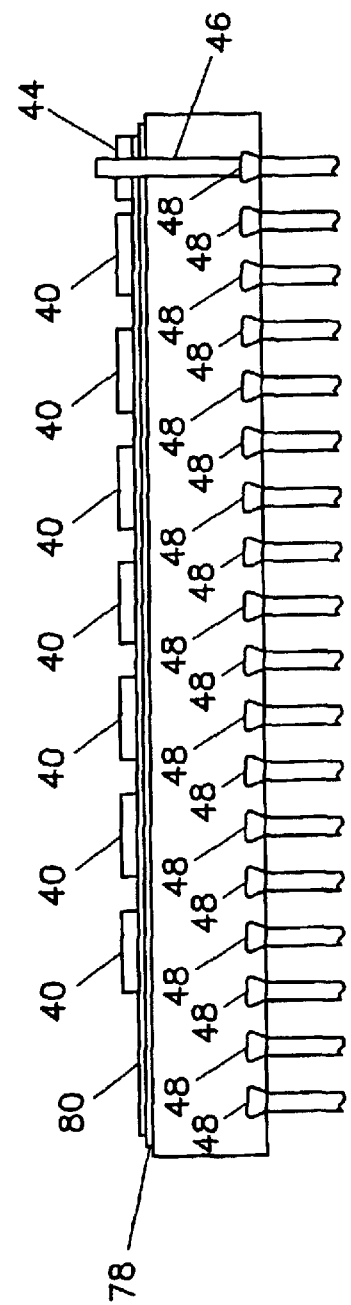
FIG. 6B is a side view of the IC lid of FIG. 6B showing the grounding plane and insulating layer between the grounding plane and the antenna.

In the embodiments having an antenna that is provided on an IC package or lid, a conductive grounding plane 78 may be provided on the surface of the package or lid using a deposition technique. Grounding plane may then be covered with a layer of insulating material 80 as shown in FIG. 4B and FIGS. 6A and 6B. A conductive tab 46 may then be soldered or otherwise connected to grounding plane 78 and the outboard end of the tab may be connected by soldering or other known connecting method to an electrical or signal ground pin of the package. In embodiments where the antenna is mounted to the underside of the IC package or lid, a conductive grounding plane 78 may be provided on the interior surface of the package or lid using a deposition technique as shown in FIG. 3B and FIG. 5B. The deposition may be performed in a manner that leaves a grounding pad exposed so a conductive pin 58 may be connected to the pad. When the package is sealed with the lid, the outboard end of the lid may connect with a signal ground pad on the IC die using a compression method to electrically couple the grounding plane to the electrical ground for the IC die.

The provision of a grounding plane between the antenna and the IC die helps reduce RF interference caused by electromagnetic radiation emitted or received at the antenna. Thus, an antenna may be provided in the interior of a ceramic or molded IC package with reduced likelihood of RF interference disturbing the operation of the IC. Likewise, an antenna may be provided adjacent to the exterior of the ceramic or molded IC package without causing substantial RF interference with the operation of the IC within the package.

The method of the present invention includes placing an antenna trace outside the integrated circuit (IC) cavity of an integrated circuit package and coupling the antenna trace to the IC within the IC cavity. By placing the antenna in the portion of the integrated circuit package that lies outside of the IC cavity, the area used for the antenna is not constrained by the dimensions of the die on which the integrated circuit is located. Thus, a larger antenna may be provided, the traces comprising the antenna may be wider or thicker than those on a die-sized substrate, and the geometry of the antenna may not be as confined as it might be on a substrate the size of the integrated circuit die.

Figure 8:
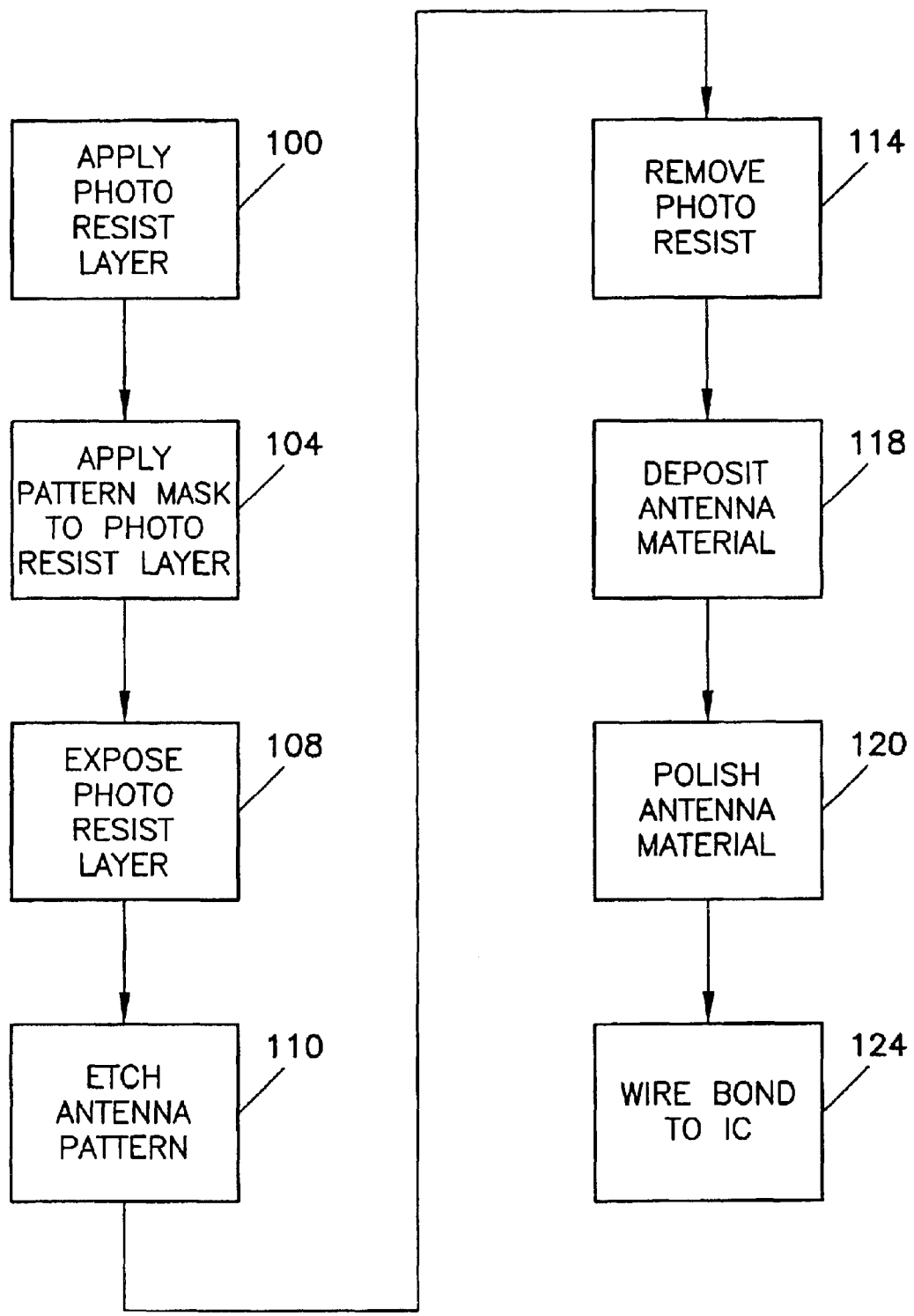
FIG. 8 is a block diagram of an exemplary process for providing an antenna for an IC within an IC package.

In an exemplary method incorporating the principles of the present invention shown in FIG. 8, a photoresist layer is applied to the area where the antenna trace is placed (Block 100). This area may be the interior portion of a molded IC package that lies outside of the IC cavity of the package, the entire floor of an IC package, or the lid of an IC package. In the case of the IC lid, a photoresist layer may be applied to either the upper or the lower surface of the lid. A mask for the geometric pattern of an antenna may be applied to the photoresist layer (Block 104). The photoresist layer is exposed (Block 108) and etched (Block 110) to provide depressions in the floor of the IC package or IC lid using known techniques. The photoresist material may be removed (Block 114) and conductive material for the antenna traces may be deposited in the antenna pattern (Block 118) by evaporation, sputtering, or other known physical or chemical deposition methods. The conductive material may be gold or gold/nickel or a magnetic permeable material such as any known permalloy. Material outside of the pattern may be removed (Block 120) by chemical mechanical polishing or the like. The antenna may then be electrically coupled to the IC within the IC cavity by wire bonding (Block 124) to either a component pad located on the IC die or a pin pad on the die. A modification that may be made to this method involves the use of a direct write process using a low-powered electronic beam or a draw process using a low-powered laser. In this version of the method of FIG. 8, the photoresist layer may be applied and then exposed with the low-powered laser or electronic beam. Thereafter, the remainder of the process shown in FIG. 8 is performed as shown in the figure.

Figure 9:
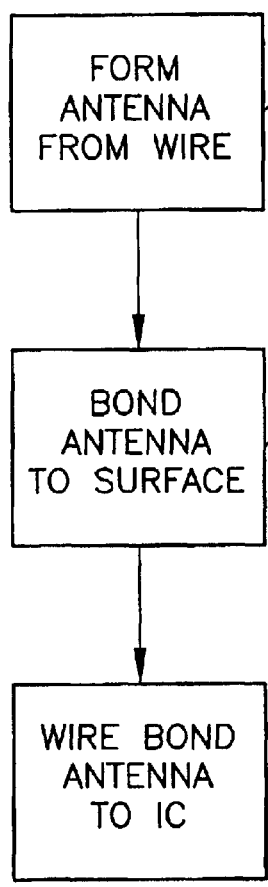
FIG. 9 is a block diagram of an alternative exemplary process for providing an antenna for an IC within an IC package.

Alternatively, an antenna trace may be placed in the interior region of an IC package or on an upper or lower surface of an IC lid as shown in FIG. 9. A small diameter conductive wire, such as a copper wire having a diameter of 0.005 inches, for example, may be wound into an antenna pattern (Block 130). The wound conductor may then be bonded to the floor of an IC package or IC lid using a known adhesive (block 134). Again, the antenna in the interior region of the molded IC package may be coupled to component pads or pin pads on the IC die using wire bonds before the IC package is sealed (Block 138).

Figure 10:
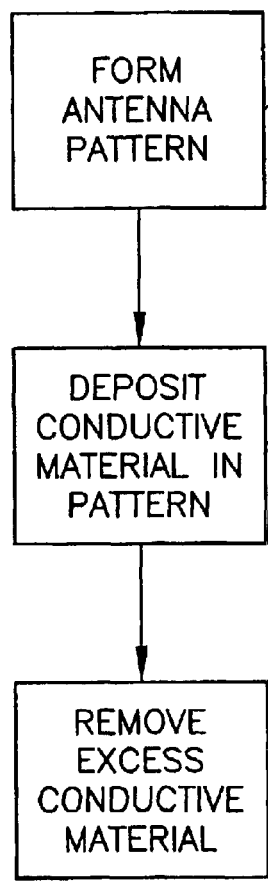
FIG. 10 is a block diagram of an exemplary process for providing an antenna in an IC package surface or lid with a draw, write or damascene process.

Another alternative method, shown in FIG. 10, may be used to implement the present invention. In this method, a trench or depression may be formed in an IC package floor or lid surface using a damascene, draw, or a direct write process (block 140). A write process may use a high-powered electronic beam and a draw process may use a high-powered laser, such as a carbon dioxide or Nd-Yag laser, to cut a trench in a surface and the beam pattern is controlled by a computer system to form a trench in the form of an antenna pattern. A conductive material is then deposited in the trenches using a known deposition technique (block 144). A known chemical-mechanical polishing method may be used to remove excess conductive material (block 146).

Figure 11:
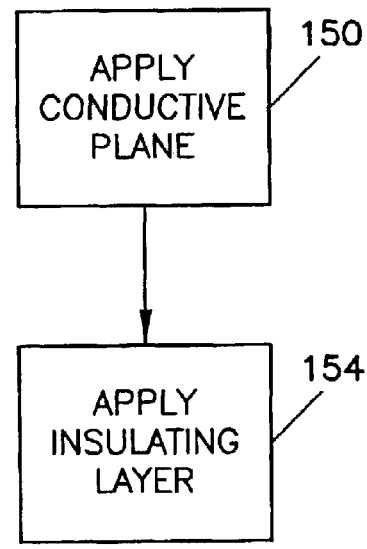
FIG. 11 is a block diagram for providing a grounding plane in association with an antenna for an IC within an IC package.

For those embodiments that use a grounding plane to reduce the likelihood of the induction of RF noise in the components of the IC die, an exemplary method such as the one shown in FIG. 11 may be used. A grounding plane may be applied to the floor of an IC package or to the surface of an IC lid (Block 150). A known deposition method may be used to apply a layer of a conductive material to the floor or lid surface or a thin sheet of a conductive metal may be bonded to the floor or lid surface. An insulating layer may be applied over the grounding plane (block 154). The insulating layer may be applied in a manner that leaves a portion of the grounding plane exposed for later coupling the grounding plane to an electrical or signal ground reference point. Alternatively, the insulating layer may substantially cover the grounding plane and be etched to expose a portion of the grounding plane for electrically coupling the plane to a reference point. The process of FIG. 11 may be continued by one of the processes shown in FIG. 8, FIG. 9, or FIG. 10 to form an antenna and couple it to an IC. The etching (block 110) of FIG. 8 or the antenna pattern formation (block 140) of FIG. 10 may include etching through or cutting the insulating layer to expose the grounding plane for electrical coupling to a reference point. Likewise, the wire bonding of FIG. 8 or FIG. 9 (blocks 124 and 138, respectively), may include wire bonding of the grounding plane to a reference point. Also, the insulating layer of the process shown in FIG. 11, the photoresist layer of the process shown in FIG. 9, and the layer in which the antenna pattern is cut in FIG. 10 may be the same layer. When the photoresist layer or layer being cut is the insulating layer, the etching or cutting to produce the depressions that receive the conductive material for forming the antenna must be done in a manner that does not reach the grounding plane. Exposure of the grounding plane in the trench where the conductive material is deposited electrically short-circuits the antenna to the grounding plane.

While the present invention has been illustrated by the description of exemplary processes and system components, and while the various processes and components have been described in considerable detail, applicant does not intend to restrict or in any limit the scope of the appended claims to such detail. Additional advantages and modifications will also readily appear to those skilled in the art. The invention in its broadest aspects is therefore not limited to the specific details, implementations, or illustrative examples shown and described. Accordingly, departures may be made from such details without departing from the spirit or scope of applicant's general inventive concept.

What is claimed is:

1. An integrated circuit package for housing an integrated circuit comprising:
    a cavity in an integrated circuit (IC) package for housing an IC;
    an antenna provided as part of the IC package and located substantially outside the cavity, the antenna further comprising a conductive trace located on a lid for the IC package; and
    a conductive tab for electrically coupling the conductive trace of the antenna to a pin of the IC package.

2. The package of claim 1 wherein the conductive trace is located on the upper surface of the lid for the IC package.

3. An integrated circuit package for housing an integrated circuit comprising:
    a cavity in an integrated circuit (IC) package for housing an IC;
    an antenna provided as part of the IC package and located substantially outside the cavity, the antenna further comprising a conductive trace located on a lid for the IC package; and
    a grounding plane located between the antenna and the lid of the IC package.

4. A method for providing an antenna with an integrated circuit package comprising:
    placing a conductive antenna trace outside an integrated circuit (IC) cavity on the lid of an IC package; and
    coupling the conductive trace to the IC located in the IC cavity of the IC package by electrically coupling the conductive trace of the antenna to a pin of the IC package with a conductive tab.

5. The method of claim 4 wherein the conductive trace placement is on the upper surface of the lid for the IC package.

6. A method for providing an antenna with an integrated circuit package comprising:
    placing an antenna trace outside an integrated circuit (IC) cavity on the lid of an IC package;
    coupling the antenna trace to the IC located in the IC cavity of the IC package; and
    placing a grounding plane between the antenna and the lid of the IC package.

7. The package of claim 1 wherein the conductive trace is located on an outside surface of the lid for the IC package.

8. The package of claim 3 wherein the conductive trace is located on an upper surface of the lid for the IC package.

9. The package of claim 3 wherein the conductive trace is located on an outside surface of the lid for the IC package.

10. The method of claim 6, wherein the placing of the antenna trace comprises the placing of the antenna trace on an outer surface of the lid of the IC package.

* * * * *